United States Patent [19]
Nussbaumer

[11] 4,020,333
[45] Apr. 26, 1977

[54] DIGITAL FILTER FOR FILTERING COMPLEX SIGNALS

[75] Inventor: Henri J. Nussbaumer, LaGaude, France

[73] Assignee: International Business Machines Corporation, Armonk, N.Y.

[22] Filed: Mar. 10, 1976

[21] Appl. No.: 665,474

[30] Foreign Application Priority Data
May 6, 1975   France ............... 75.00065150

[52] U.S. Cl. .................. 235/156; 333/18; 333/70 T
[51] Int. Cl.² ............ G06F 7/38; G06F 15/34
[58] Field of Search ......... 235/152, 156; 333/18, 333/28 R, 70 T; 328/167

[56] References Cited
UNITED STATES PATENTS

| | | | |
|---|---|---|---|
| 3,679,882 | 7/1972 | McAuliffe | 235/156 |
| 3,906,347 | 9/1975 | Motley et al. | 333/18 X |
| 3,914,588 | 10/1975 | Nussbaumer | 333/70 T X |
| 3,926,367 | 12/1975 | Bond et al. | 235/156 X |

*Primary Examiner*—Jerry Smith
*Attorney, Agent, or Firm*—Edward H. Duffield

[57] ABSTRACT

In a Fermat representation of numbers, the imaginary operator $j$ is a real number which is a power of two. This is applied here to the implementation of complex digital filters, i.e., filters deriving the real and imaginary components of the desired filtered signal $y$ by processing the components of the input signal $x$. Let $(xm, \hat{x}m)$ and $(ym, \hat{y}m)$ be samples of the real and imaginary components of $x$ and $y$, respectively. The samples $xm$ are delayed to provide $j\,\hat{x}m$ in the Fermat system, then both $xm$ and $j\,\hat{x}m$ are fed to digital adders to provide $xm + j\,\hat{x}m$ and $xm - j\,\hat{x}m$, which are separately applied to the input of transversal digital filters. The outputs of said filters are combined in simple digital adders to provide the desired $y$ components.

35 Claims, 6 Drawing Figures

FOR A,B,C,D SEE FIG. 4A

FIG. 4A
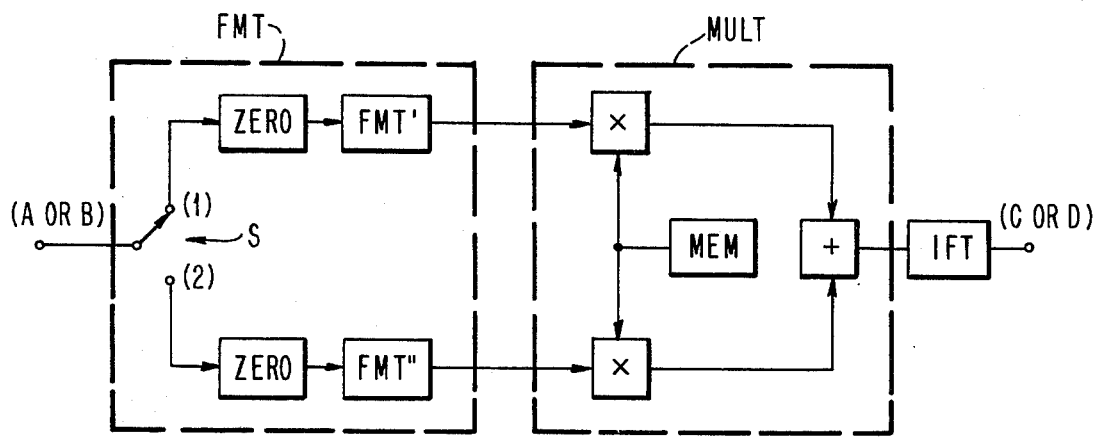
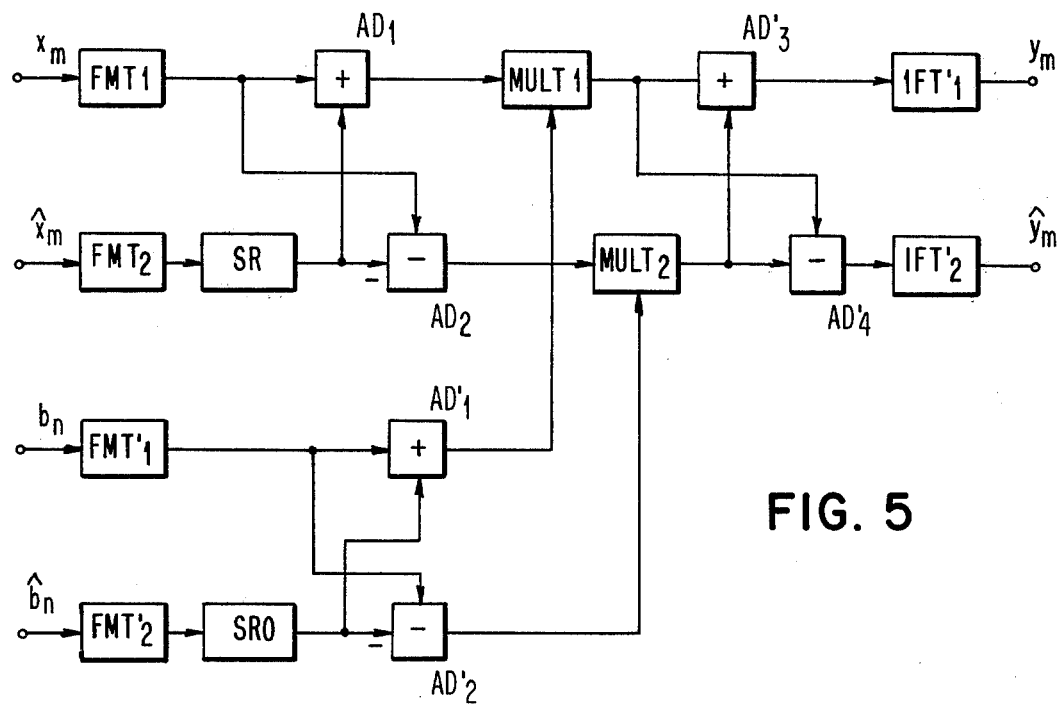
FIG. 5

DIGITAL FILTER FOR FILTERING COMPLEX SIGNALS

FIELD OF THE INVENTION

This invention relates to digital filters and, more particularly, to those digital filters which are designed to process complex signals.

PRIOR ART

Digital filters in general, and in particular digital filters which are designed for processing complex signals are well known in the art. In addition, the use of various mathematical transformations as embodied in the circuitry for performing filtering functions have been described in such publications as "The Relationship Between Two Fast Fourier Transforms" by I. J. Good in IEEE Transactions on Computers, March, 1971, pages 310–317 and in "Fast One-Dimensional Digital Convolutions by Multi-Dimensional Techniques," by Agaival and Burrus in IEEE Transactions on ASSP, Feb., 1974, pages 1–10.

The prior art, however, generally requires a complex filter for each of the real and imaginary components each of which requires mathematical transformation circuits to be constructed. When crossed arm filters are utilized, four transversal filter operations using N coefficients are generally required in the prior art.

OBJECTS OF THE INVENTION

In view of the foregoing prior art and the difficulties encountered therein, it is an object of this invention to provide an improved means and method for performing transversal filtering operations in digital filters for the complex signals which results in reducing the number of transversal filters and filtering operations required for performing the filtering operations.

SUMMARY OF THE INVENTION

Let $X_{(t)} = A_{(t)} e^{j(\omega t + \phi)} (t)$ be a complex signal, where
X is the complex signal
A is the amplitude of the signal
$t$ is the time variable
$e$ is the base of the natural logarithms
$\omega$ is the angular frequency, and
$\Omega$ is the phase angle
$j$ is the imaginary operator $\sqrt{-1}$.
One may write $$X_{(t)} = A_{(t)} \cos(\omega t + \phi_{(t)}) + j A_{(t)} \sin(\omega t + \phi_{(t)}) = x_{(t)} + j \hat{x}_{(t)}.$$

When it is desired to filter this signal using a filter, the impulse reponse of which is $$C_{(t)} = B_{(t)} e^{j\theta}(t) = B_{(t)} \cos\theta_{(t)} + j B_{(t)} \sin\theta_{(t)} = b_{(t)} + j \hat{b}_{(t)},$$

the resultant signal $Y_{(t)}$ itself is a complex signal. One may write $$Y_{(t)} = y_{(t)} + j \hat{y}_{(t)}.$$

Generally, the filtering operation takes the form of a convolution operation $$Y_{(t)} = C_{(t)} \times X_{(t)},$$

which, when sampled signals are being processed, is expressed by $$Y_m = \sum_{n=1}^{N} X_{m-n} C_n$$

This shows that a filtered signal sample $Y_m$ is derived from a sum of those samples of $X_{(t)}$ which precede $X_m$ and are weighted with coefficients that define the filter.

It may be inferred from the foregoing that the components of the filtered complex signal are $$y_m = \sum_{n=1}^{N} (x_{m-n} b_n - \hat{x}_{m-n} \hat{b}_n) \quad (1)$$

$$\hat{y}_m = \sum_{n=1}^{N} (\hat{x}_{m-n} b_n + x_{m-n} \hat{b}_n) \quad (2)$$

A complex filter relying upon the direct application of expressions (1) and (2) would necessitate $4N+2$ additions and $4N$ multiplications to generate each filtered signal sample, which would be equivalent to performing four transversal filtering operations using N coefficients. This would generally be costly and complex.

The present invention makes it possible to substantially reduce the complexity and power of the circuitry required to perform such a filtering operation.

BRIEF DESCRIPTION OF THE DRAWINGS

The foregoing and other objects, features and advantages of the invention will be apparent from the following more particular description of a preferred embodiment of the invention, as illustrated in the accompanying drawings.

FIGS. 4A and 5 illustrate filtering devices that use the Fermat transform in accordance with the present invention.

In order that the invention may be more readily understood, a conventional complex filter making direct use of expressions (1) and (2) will first be described. As shown in FIG. 1, samples $x_m$ and $\hat{x}_m$ of the components of $x_{(t)}$ are fed to shift registers SR1 and SR2, respectively. These registers are provided with N taps t each of which is connected to the inputs of each of two multipliers $M_1$ through $M_n$ as shown. The second input of each multiplier M is supplied with a coefficient belonging to one of the families $b$ or $\hat{b}$. The outputs of the multipliers M are successively added in adders $A_1$ through $A_{1-1}$ to provide:

$$y'_m = \sum_{n=1}^{N} x_{m-n} b_n;$$

$$y''_m = \sum_{n=1}^{N} \hat{x}_{m-n} \cdot \hat{b}_n;$$

$$\hat{y}'_m = \sum_{n=1}^{N} \hat{x}_{m-n} \cdot b_n;$$

$$\hat{y}''_m = \sum_{n=1}^{N} x_{m-n} \cdot \hat{b}_n.$$

Figure 1:
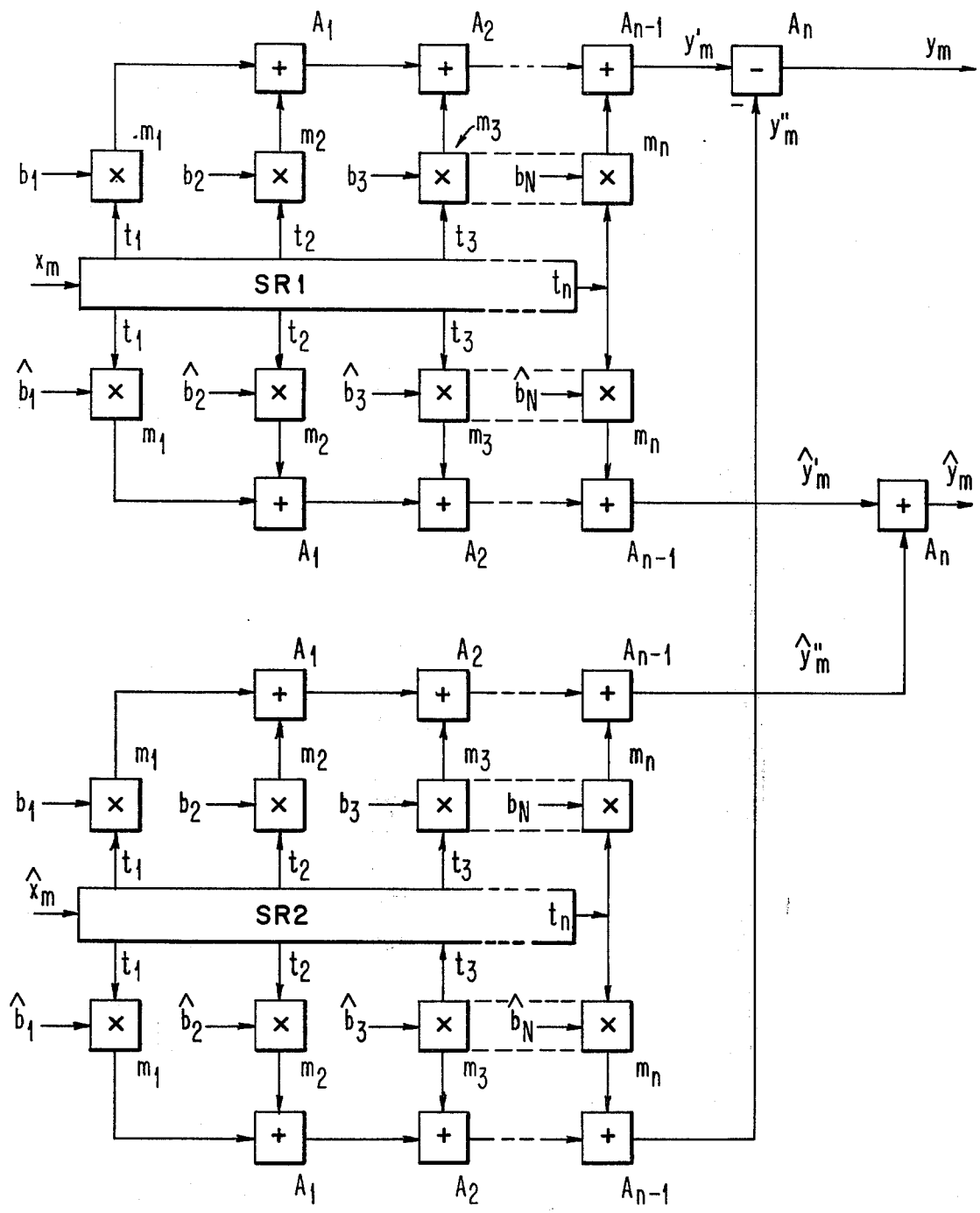
FIG. 1 shows a conventional complex filter.

Two additional adders $A_n$ (one of which functions as a subtractor as shown) then generate $$y_m = y'_m = y''_m \text{ and } \hat{y}_m = \hat{y}'_m + \hat{y}''_m$$

Thus, such a device requires the power equivalent to that of four conventional transversal filters. The present invention makes it possible to obtain the same results in a much simpler way.

Let p be a prime number. It can be shown that there exist integers g called primitive roots of p such that the series $$\{((g^1)), ((g^2)), \ldots, ((g^{p-1}))\}$$

will contain all number included between 1 and $p-1$. In this instance, the terms between double parentheses are modulo p terms. It should first be noted that, except where $p=2$, $p-1$ is even, so that said series comprises an even number of integers. In this notation system, all positive and negative integers between $-(p-1)/2$ and $+(p-1)/2$ can be represented.

It can also be shown that if $(p-1/2)$ is even, the imaginary number $j = \sqrt{-1}$ has an equivalent in the system of the present invention, namely $$\left(\left(g^{\frac{p-1}{4}}\right)\right),$$

that is, a real integer belonging to the series of numbers 1 to $p-1$. If, among all prime numbers for which the number j is real, we limit ourselves to the Fermat numbers, i.e., to those numbers for which $p=2^{2^q}+1$ with p being a prime number, it follows that $$\left(\left(g^{\frac{p-1}{2}}\right)\right) \equiv 2^{2^q} \equiv -1$$

(as used here, the symbol $\equiv$ means "congruent to") hence $$\left(\left(g^{\frac{p-1}{4}}\right)\right) = \left(\left(\sqrt{-1}\right)\right) = 2^{2^{(q-1)}}.$$

In the Fermat system, the number representing j is a power of two, which is particularly interesting when dealing with binary numbers since real numbers can then be converted into imaginary numbers and vice versa through the simple expedient of shifting bits.

Accordingly, expressions (1) and (2) can be written as $$2y_m = \sum_{n=1}^{N} [(x_{m-n} + j\hat{x}_{m-n})(b_n + j\hat{b}_n) + (x_{m-n} - j\hat{x}_{m-n})(b_n - j\hat{b}_n)] \quad (3)$$

$$2j\hat{y}_m = \sum_{n=1}^{N} [(x_{m-n} + j\hat{x}_{m-n})(b_n + j\hat{b}_n) - (x_{m-n} - j\hat{x}_{m-n})(b_n - j\hat{b}_n)] \quad (4)$$

or, equivalently $$((2y_m)) = \left(\left(\sum_{n=1}^{N}\left[\left(x_{m-n} + 2^{2^{(q-1)}}\hat{x}_{m-n}\right)\left(b_n + 2^{2^{(q-1)}}\hat{b}_n\right)\right.\right.\right.$$
$$\left.\left.\left. + \left(x_{m-n} - 2^{2^{(q-1)}}\hat{x}_{m-n}\right)\left(b_n - 2^{2^{(q-1)}}\hat{b}_n\right)\right]\right)\right) \quad (5)$$

$$\left(\left(2^{2^{(q-1)}}\hat{y}_m\right)\right) = \left(\left(\sum_{n=1}^{N}\left[\left(x_{m-n} + 2^{2^{(q-1)}}\hat{x}_{m-n}\right)\left(b_n + 2^{2^{(q-1)}}\hat{b}_n\right)\right.\right.\right.$$
$$\left.\left.\left. - \left(x_{m-n} - 2^{2^{(q-1)}}\hat{x}_{m-n}\right)\left(b_n - 2^{2^{(q-1)}}\hat{b}_n\right)\right]\right)\right) \quad (6)$$

To multiply a word of one or more bits by $2^{2^{(q-1)}}$ is equivalent to shifting the bits of the word $2^{q-1}$ positions. Expressions (5) and (6) show that the complex filter of the invention can be implemented in such a way as to require half the number of multipliers as the filter of FIG. 1. The circuitry power required need only be equivalent to that of two conventional transversal filters.

Figure 2:
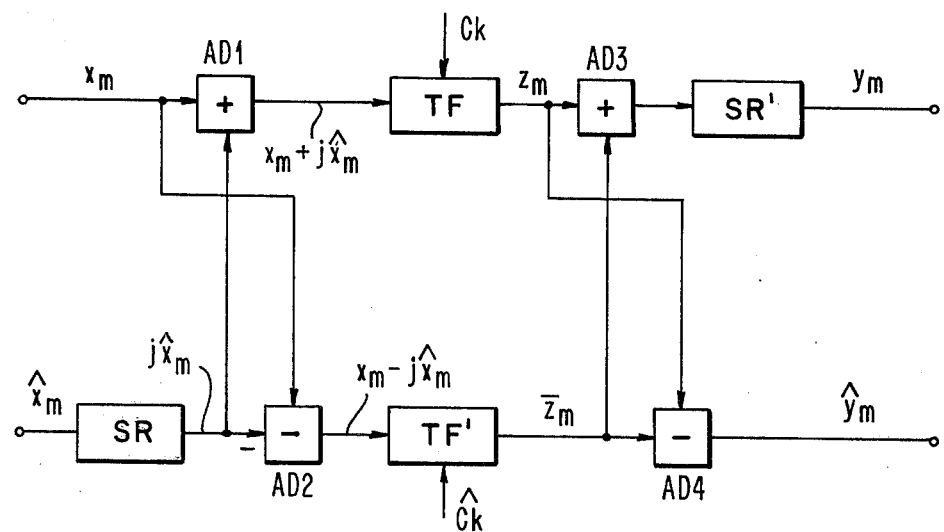
FIGS. 2, 3 and 4 illustrate complex filters realized in accordance with the present invention.

An embodiment of the invention is shown in block diagram form in FIG. 2. This embodiment has two inputs to which the samples $x_m$ and $\hat{x}_m$ are respectively applied. The term $\hat{x}_m$ is first delayed $2^{(q-1)}$ bit times using a shift register SR, which therefore provides $j\hat{x}_m$. The terms $(x_m + j\hat{x}_m)$ and $(x_m - j\hat{x}_m)$ are then obtained quite simply by means of an adder AD1 and a subtractor AD2.

To simplify the description of the invention, it will first be assumed that the filter has fixed coefficients. Consequently, the normal $(b_{(t)})$ and quadrature $(\hat{b}_{(t)})$ components of the impulse response $(C_{(t)})$ of the filter would be defined at the time it is built and it would be possible to derive therefrom the corresponding values of coefficients $b_k$ and $\hat{b}_k$. However, as expressions (3) to (6) show, the transversal filtering operations to be performed on signals $x_{(t)} + j\hat{x}_{(t)}$ and $x_{(t)} - j\hat{x}_{(t)}$ must have coefficients derived from $b_k + j\hat{b}_k$ and $b_k - j\hat{b}_k$. Since, in this instance, the term j is a real number, the transforms of the coefficients of the transversal filters to be realized, namely $$C_K = \frac{b_k + 2^{2^{(q-1)}} \cdot \hat{b}_k}{2}.$$

and
$$\hat{C}_K = \frac{b_k - 2^{2^{(q-1)}} \hat{b}_k}{2}.$$

will be calculated beforehand and stored.

The term $(x_m + j \hat{x}_m)$ is fed to a transversal filter TF, the coefficients of which are of the $C_k$ form, while the term $(x_m - j \hat{x}_m)$ is supplied to a transversal filter TF', the coefficients of which are of the $\hat{C}_k$ form. The outputs of TF and TF' provide respectively modulo p terms $z_m$ and $\hat{z}_m$ such that $$z_m = \frac{1}{2} \sum_{n=1}^{N} \left( x_{m-n} + 2^{2^{(q-1)}} \cdot \hat{x}_{m-n} \right) \left( b_n + 2^{2^{(q-1)}} \hat{b}_n \right).$$

$$\hat{z}_m = \frac{1}{2} \sum_{n=1}^{N} \left( x_{m-n} - 2^{2^{(q-1)}} \cdot \hat{x}_{m-n} \right) \left( b_n - 2^{2^{(q-1)}} \hat{b}_n \right).$$

The samples $y_m$ and $\hat{y}_m$ of the desired filtered signals are obtained by means of modulo p additions and subtractions of terms $z_m$ and $\hat{z}_m$ in adders AD3 and AD4, respectively, to yield $y_m$ and $\hat{y}_m$.

Figure 4:
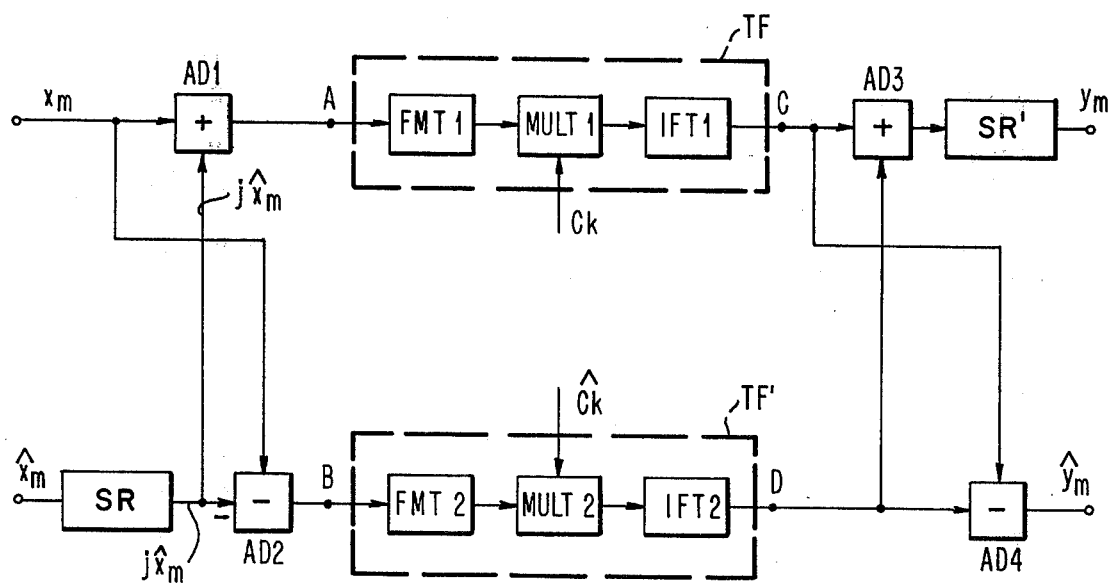
Figure 3:
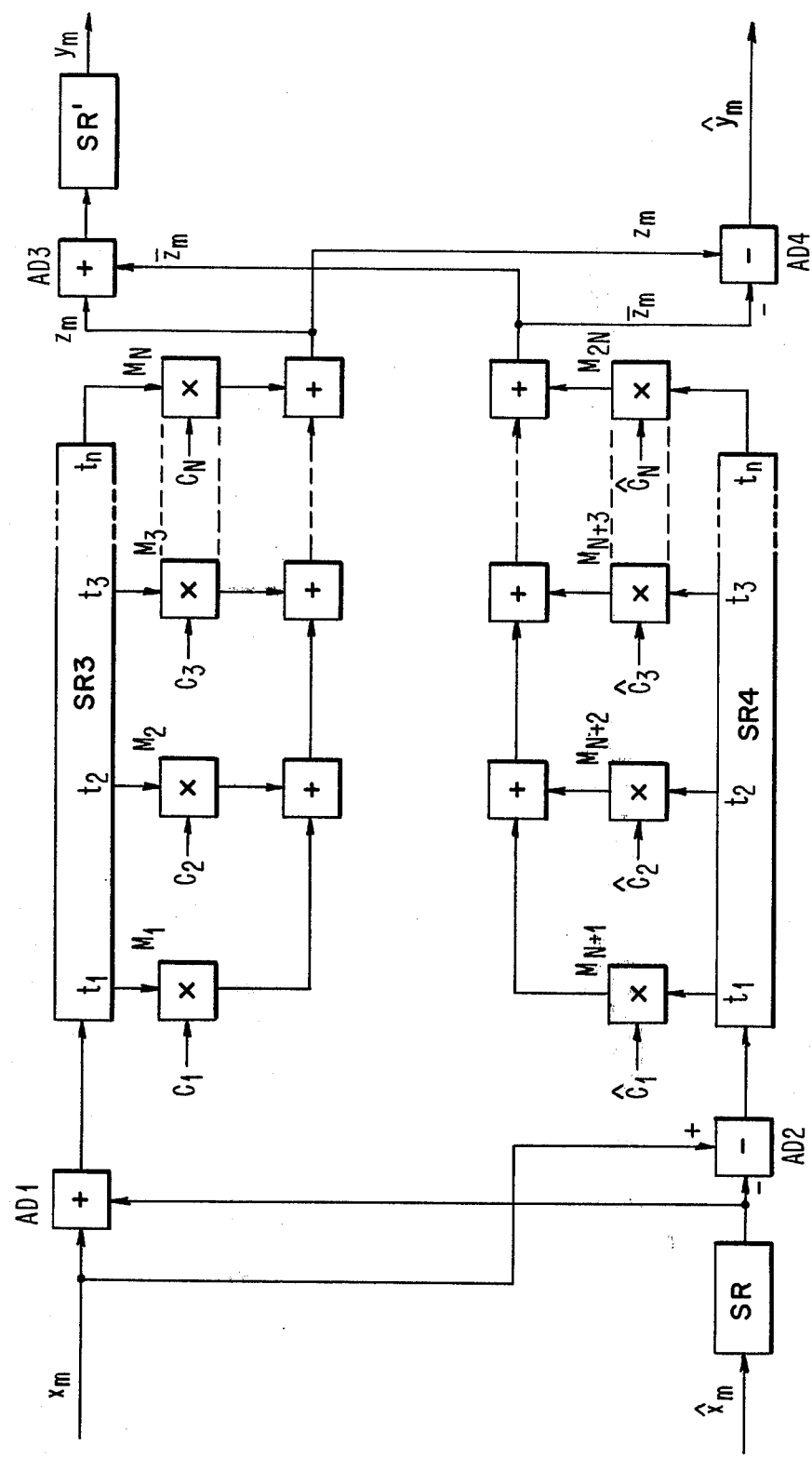

The transversal filters for constructing a digital filter such as FIG. 2 to operate in this fashion can be implemented in various ways, with FIGS. 3 and 4 being illustrative thereof.

As shown in FIG. 3, it would be feasible to connect the outputs of AD1 and AD2 to the inputs of shift registers SR3 and SR4 comprising N word positions and N taps t each; then to connect each tap to one of the modulo p multipliers $M_1$, $M_{2N}$ the second input of which respectively, receives one of the coefficients of the $C_k$ form from SR3 and of the $\hat{C}_k$ form from SR4; and finally to add the outputs of the multipliers together so as to obtain $z_m$ and $\hat{z}_m$. The component $y_m$ is obtained by performing a modulo p addition of $z_m$ and $\hat{z}_m$ in AD3 and by shifting the bits of the result $2^{q-1}$ positions in SR', while $\hat{y}_m$ is obtained by means of a modulo p subtraction of $z_m$ and $\hat{z}_m$ in AD4.

The transversal filters can also take the form of the circular convolution function generators described in U.S. Pat. applications Ser. No. 670,325 and 665,473 respectively filed on Mar. 25, 1976 and Mar. 10, 1976 by the present applicant. Some precautions should, however, be taken in such cases due to the fact that the terms to be processed have already been expressed in a Fermat system.

A degenerate form of the primitive roots transform, namely, the Fermat transform which is also related to the Mersenne transform, could also be used here with circular convolution function generators as follows.

The Fermat transform permits converting a series of numbers $\{x_n\}$ of length p into a series $\{X_k\}$ defined by $$X_k = \left(\left( \sum_{n=0}^{2^{(q+1)}-1} x_n \cdot 2^{nk} \right)\right) \quad (7)$$

where the quantities between double parentheses are modulo $p = 2^{2^q} + 1$ quantities. It can be shown that the convolution theorem applies to this transform. In other words, if $\{X_k\}$ and $\{B_k\}$ are the transforms of $\{x_n\}$ and $\{b_n\}$, the inverse transform $\{y_n\}$ of the series $\{Y_k\}$ consisting of the products of corresponding couples of terms of the two direct transforms, such as $Y_k = ((X_k \cdot B_k))$, will provide $$y_n = \left(\left( \sum_{m=0}^{2^{q+1}-1} x_{<m-n>} \cdot b_m \right)\right),$$

with the term between $< >$ being a modulo $q^{2+1}-1$ term.

Accordingly, in order to convolve two values $\{x_n\}$ and $\{b_n\}$, it may prove advantageous to use the Fermat transform so as to reduce the circuitry power required.

However, what is particularly interesting in this instance is the fact that complex series $\{x_n + j \hat{x}_n\}$ and $\{b_n + j \hat{b}_n\}$ are to be processed. If $\{X_k\}$, $\{\hat{X}_k\}$, $\{B_k\}$ and $\{\hat{B}_k\}$ are the Fermat transforms of the terms $\{x_n\}$, $\{\hat{x}_n\}$, $\{b_n\}$ and $\{\hat{b}_n\}$, then the Fermat transforms of the two complex series will be $$\{((X_k + j \hat{X}_k))\} \text{ and } \{((B_k + j \hat{B}_k))\}$$

Taking the above-mentioned properties into account, the Fermat transform of the filtered signal verifies the relation $$Y_k + j \hat{Y}_k = (([X_k + j \hat{X}_k] [B_k + j \hat{B}_k]))$$

hence
$$Y_k = X_k B_k - \hat{X}_k \hat{B}_k$$

$$\hat{Y}_k = X_k \hat{B}_k + \hat{X}_k B_k.$$

Since $j$ is, in this instance, a real number, one can perform the operations $$(X_k - j \hat{X}_k)(B_k - j \hat{B}_k)$$

$$(X_k + j \hat{X}_k)(B_k + j \hat{B}_k)$$

using two multipliers only, $Y_k$ and $\hat{Y}_k$ being derived therefrom by means of simple binary additions.

The desired digital filter can therefore be implemented in accordance with FIG. 4. The terms $x_m + j \hat{x}_m$ and $x_m - j \hat{x}_m$ are separately fed to Fermat transform generators FMT1 and FMT2, which generate $X_k + j \hat{X}_k$ and $X_k - j \hat{X}_k$. The latter terms are fed to multipliers MULT1 and MULT2 which also receive the transforms $C_k$ and $\hat{C}_k$ of the coefficients of the filters TF and TF' to be realized. The terms supplied by the multipliers are fed to inverse Fermat transform generators 1FT1 and 1FT2, which supply $z_m$ and $\hat{z}_m$. The latter terms are applied to circuits AD3, AD4 and SR'. The terms $y_m$ and $\hat{y}_m$ are then obtained at the output of SR' and AD4, respectively.

Actually, the use of the Mersenne, Fermat or primitive roots transforms leads to the performance of circular convolutions whereas the filtering operation requires aperiodic convolutions. This problem has been alluded to in the previously mentioned patent applications and a solution proposed. Briefly, said solution consists in dividing the sequence of data to be processed into blocks of finite length to which a sequence of terms equal to zero is added. A circular convolution of each of the groups thus formed is then performed using the selected transform. The terms resulting from two consecutive circular convolutions are then added together to provide the terms of the desired aperiodic convolution.

A transversal filter intended for the circuit of FIG. 4 is shown in block diagram form in FIG. 4A. The circuits located between A and B (or between C and D) are shown in FIG. 4A, taking the above remarks into consideration. A switch S is used to alternatively apply the data blocks to paths (1) and (2). A sequence of zeros is added to each block before the latter is fed to a device FMT' or FMT'' which develops the desired signal transform (such as the Fermat transform). The outputs of FMT' and FMT'' are applied to multipliers (X) in which each output term is multiplied by $C_k$ (or $\check{C}_k$) as supplied by the transforms of the coefficients of the transversal function to be realized a memory MEM. The outputs of the multipliers are added together, term for term, in an adder (+), the output of which is then applied to the device 1 FT which generates the inverse transform.

As previously mentioned, to multiply a word by $j$ is equivalent in the Fermat system to shifting the bits of that word $2^{(q-1)}$ positions. Any term $j \, x$ is therefore somewhat longer than $x$. Since the advantages of devices which use transforms are limited, in practice, by the lengths of the words to be transformed, it may be desirable to locate devices FMT1 and FMT2 in such a way that they will directly act upon $\{x_m\}$ and $\{\hat{x}_m\}$. This is the case in the FIG. 5 arrangement wherein it has been assumed that it was desired to perform a variable-coefficient filtering operation.

In FIG. 5, the data $\{x_n\}$ and $\{\hat{x}_n\}$ and the coefficients $\{b_n\}$ and $\{\hat{b}_n\}$ are initially fed to Fermat transform generators FMT1, FMT2, FMT'1 and FMT'2. The outputs of FMT2 and FMT'2 are multiplied by $j$ using a shift register SR or SRO. They are then added to the outputs of FMT1 and FMT'1 and subtracted therefrom. Multipliers MULT1 and MULT2 then multiply the terms applied thereto by AD1, AD'1 and AD2, AD'2, respectively. The outputs of MULT1 and MULT2 are then added together in AD'3 and subtracted from each other in AD'4 to generate the terms $X_k B_k - \hat{X}_k \hat{B}_k$ and $X_k \hat{B}_k + \hat{X}_k B_k$ which will be applied to inverse Fermat transform generators 1FT'1 and 1FT'2 to obtain, at the outputs thereof, $y_m$ and $\hat{y}_m$.

It will be understood that the remarks previously made about the circular and the aperiodic convolutions are equally applicable to the FIG. 5 device.

All of the components of the devices illustrated in FIGS. 4 and 5 are of a conventional nature, with the exception of the Fermat transform generators and the inverse Fermat transform generators. However, it can be shown that a primitive roots transform can reduce to a Fermat transform. It is therefore possible to use primitive roots transform generators of the type described in the aforementioned patent application Ser. No. 665,473.

In addition, the Fermat transform is very similar to the Mersenne transform and can therefore be developed by means of devices such as those shown in FIGS. 1 and 2 of an article entitled, "Discrete Convolutions via Mersenne Transforms," by Charles M. Rader, published in IEEE Transactions on Computers, Vol. C-21, No. 12, December 1972, pages 1269–1273.

The device of FIG. 5, which uses variable coefficients, makes it possible to realize equalizers particularly useful in the transmissions area.

While the invention has been particularly shown and described with reference to a preferred embodiment thereof, it will be understood by those skilled in the art that various changes in form and detail may be made therein without departing from the spirit and scope of the invention.

What is claimed is:

1. Digital filter for filtering complex signals, of the type which is fed with samples of the real and imaginary components of the signal to be filtered and provides separately the components of the filtered signal, characterized in that it includes:
   first means for multiplying by j, the $\sqrt{-1}$, said samples of said imaginary component of the signal to be filtered in a system wherein j is represented by a real number;
   second means for adding said samples of said real component to those of said imaginary component multiplied by said real number;
   third means for subtracting the samples multiplied by said real number from those of the real component;
   fourth means for passing separately the signals supplied by said second and third means through transversal filtering means;
   fifth means for adding together and for subtracting from each other the samples resulting from the transversal filtering operations; and
   sixth means for multiplying by said real number the terms resulting from the additions performed by said fifth means.

2. Digital filter according to claim 1, characterized in that said transversal filtering means are of a conventional type comprising: delay lines having output taps for each increment of delay, binary multipliers connected individually to each of said taps, and binary adders connected individually to the outputs of each of said multipliers and to the output of the next previous said adder, if any, to provide the summed multiplied output from two adjacent said taps.

3. Digital filter according to claim 1, characterized in that said transversal filtering means include convolution function generators making use of the so-called primitive roots transform.

4. Digital filter according to claim 3, characterized in that said fourth means includes for each transversal filtering path:
   means for dividing the (data) signal to be filtered into blocks of finite length, and means for completing each block by means of a sequence of terms equal to zero, and means for alternately routing the blocks thus completed to a first device and to a second device generating (the selected) mathematical transforms for said signal in a system where j is a real number;
   multiplier means for multiplying the terms of (the data) said signal transforms as completed by means of a sequence of terms equal to zero, by the corresponding transform terms of the coefficents of (the desired) said transversal filter (as completed by means of a sequence of terms equal to zero);
   adder means for adding together the terms provided by said multiplier means and resulting from the processing of two consecutive blocks of (data) signals; and
   means for developing the inverse transform of the sequence of terms supplied by said adder means.

5. Digital filter according to claim 4, characterized in that it includes: means for storing (said) the desired transform(s) filter coefficients for blocks of the signal coefficients, (as) said blocks being completed by means of a sequence of zeros, and said signal coefficients resulting from an addition or a subtraction of terms derived from the real and imaginary components of the impulse response of the filter.

6. Digital filter according to claim 3, characterized in that it includes: means for storing (said) the desired transform(s) filter coefficients for blocks of the signal coefficients, (as) said blocks being completed by means of a sequence of zeros, and said signal coefficients resulting from an addition or a subtraction of terms derived from the real and imaginary components of the impulse response of the filter.

7. Digital filter according to claim 1, characterized in that said transversal filtering means include convolution function generators making use of the so-called Mersenne transform.

8. Digital filter according to claim 7, characterized in that said fourth means includes for each transversal filtering path:
means for dividing the (data) signal to be filtered into blocks of finite length, and means for completing each block by means of a sequence of terms equal to zero, and means for alternately routing the blocks thus completed to a first device and to a second device generating (the selected) mathematical transforms for said signal in a system where j is a real number;
multiplier means for multiplying the terms of (the data) said signal transforms as completed by means of a sequence of terms equal to zero, by the corresponding transform terms of the coefficients of (the desired) said transversal filter (as completed by means of a sequence of terms equal to zero);
adder means for adding together the terms provided by said multiplier means and resulting from the processing of two consecutive blocks of (data) signals; and
means for developing the inverse transform of the sequence of terms supplied by said adder means.

9. Digital filter according to claim 8, characterized in that it includes: means for storing (said) the desired transform(s) filter coefficients for blocks of the signal coefficients, (as) said blocks being completed by means of a sequence of zeros, and said signal coefficients resulting from an addition or a subtraction of terms derived from the real and imaginary components of the impulse reponse of the filter.

10. Digital filter according to claim 7, characterized in that it includes: means for storing (said) the desired transform(s) filter coefficients for blocks of the signal coefficients, (as) said blocks being completed by means of a sequence of zeros, and said signal coefficients resulting from an addition or a subtraction of terms derived from the real and imaginary components of the impulse response of the filter.

11. Digital filter according to claim 1, characterized in that said transversal filtering means include convolution function generators making use of the Fermat transform.

12. Digital filter according to claim 11, characterized in that said fourth means includes for each transversal filtering path:
means for dividing the (data) signal to be filtered into blocks of finite length, and means for completing each block by means of a sequence of terms equal to zero, and means for alternately routing the blocks thus completed to a first device and to a second device generating (the selected) mathematical transforms for said signal in a system where j is a real number;
multiplier means for multiplying the terms of (the data) said signal transforms as completed by means of a sequence of terms equal to zero, by the corresponding transform terms of the coefficients of (the desired) said transversal filter (as completed by means of a sequence of terms equal to zero);
adder means for adding together the terms provided by said multiplier means and resulting from the processing of two consecutive blocks of (data) signals; and
means for developing the inverse transform of the sequence of terms supplied by said adder means.

13. Digital filter according to claim 12, characterized in that it includes: means for storing (said) the desired transform(s) filter coefficients for blocks of the signal coefficients, (as) said blocks being completed by means of a sequence of zeros, and said signal coefficients resulting from an addition or a subtraction of terms derived from the real and imaginary components of the impulse response of the filter.

14. Digital filter according to claim 11, characterized in that it includes: means for storing (said) the desired transform(s) filter coefficients for blocks of the signal coefficients, (as) said blocks being completed by means of a sequence of zeros, and said signal coefficients resulting from an addition or a subtraction of terms derived from the real and imaginary components of the impulse reponse of the filter.

15. Digital filter according to claim 1, characterized in that said fourth means includes for each transversal filtering path:
means for dividing the (data) signal to be filtered into blocks of finite length, and means for completing each block by means of a sequence of terms equal to zero, and means for alternately routing the blocks thus completed to a first device and to a second device generating (the selected) mathematical transforms for said signal in a system where j is a real number;
multiplier means for multiplying the terms of (the data) said signal transforms as completed by means of a sequence of terms equal to zero, by the corresponding transform terms of the coefficients of (the desired) said transversal filter (as completed by means of a sequence of terms equal to zero);
adder means for adding together the terms provided by said multiplier means and resulting from the processing of two consecutive blocks of (data) signals; and
means for developing the inverse transform of the sequence of terms supplied by said adder means.

16. Digital filter according to claim 15, characterized in that it includes: means for storing (said) the desired transform(s) filter coefficients for blocks of the signal coefficients, (as) said blocks being completed by means of a sequence of zeros, and said signal coefficients resulting from an addition or a subtraction of terms derived from the real and imaginary components of the impulse response of the filter.

17. Digital filter for filtering complex signals, of the type which is fed with samples of the real and imaginary components of the signal to be filtered and provides separately the components of the filtered signal, characterized in that it includes:
first means for delaying the samples of the imaginary component of the signal to be filtered;

second means for adding the samples of the real component to the delayed samples of the imaginary component;

third means for subtracting the delayed samples from those of the real component;

fourth means for passing separately the signals supplied by said second and third means through transversal filtering means;

fifth means for adding together and for subtracting from each other the samples resulting from the transversal filtering operations; and sixth means for delaying the terms resulting from the additions performed by said fifth means.

18. Digital filter for filtering complex signals as described in claim 17, wherein:
said means which introduce the delays consists of shift registers with $2^{q-1}$ bit positions $q$ being a real integer.

19. Digital filter according to claim 18, characterized in that said transversal filtering means are of a conventional type comprising: delay lines having output taps for each increment of delay, binary multipliers connected individually to each of said taps, and binary adders connected individually to the outputs of each of said multipliers and to the output of the next previous said adder, if any, to provide the summed multiplied output from two adjacent said taps.

20. Digital filter according to claim 18, characterized in that said transversal filtering means include convolution function generators making use of the so-called primitive roots transform.

21. Digital filter according to claim 20, characterized in that it includes: means for storing (said) the desired transform(s) filter coefficients for blocks of the signal coefficients, (as) said blocks being completed by means of a sequence of zeros, and said signal coefficients resulting from an addition or a subtraction of terms derived from the real and imaginary components of the impulse response of the filter.

22. Digital filter according to claim 18, characterized in that said transversal filtering means include convolution function generators making use of the so-called Mersenne transform.

23. Digital filter according to claim 22, characterized in that it includes: means for storing (said) the desired transform(s) filter coefficients for blocks of the signal coefficients, (as) said blocks being completed by means of a sequence of zeros, and said signal coefficients resulting from an addition or a subtraction of terms derived from the real and imaginary components of the impulse response of the filter.

24. Digital filter according to claim 18, characterized in that said transversal filtering means include convolution function generators making use of the Fermat transform.

25. Digital filter according to claim 24, characterized in that it includes: means for storing (said) the desired transform(s) filter coefficients for blocks of the signal coefficients, (as) said blocks being completed by means of a sequence of zeros, and said signal coefficients resulting from an addition or a subtraction of terms derived from the real and imaginary components of the impulse response of the filter.

26. Digital filter according to claim 17, characterized in that said transversal filtering means are of a conventional type comprising: delay lines having output taps for each increment of delay, binary multipliers connected individually to each of said taps, and binary adders connected individually to the outputs of each of said multipliers and to the output of the next previous said adder, if any, to provide the summed multiplied output from two adjacent said taps.

27. Digital filter according to claim 17, characterized in that said transversal filtering means include convolution function generators making use of the so-called primitive roots transform.

28. Digital filter according to claim 27, characterized in that it includes: means for storing (said) the desired transform(s) filter coefficients for blocks of the signal coefficients, (as) said blocks being completed by means of a sequence of zeros, and said signal coefficients resulting from an addition or a subtraction of terms derived from the real and imaginary components of the impulse response of the filter.

29. Digital filter according to claim 17, characterized in that said transversal filtering means include convolution function generators making use of the so-called Mersenne transform.

30. Digital filter according to claim 29, characterized in that it includes: means for storing (said) the desired transform(s) filter coefficients for blocks of the signal coefficients, (as) said blocks being completed by means of a sequence of zeros, and said signal coefficients resulting from an addition or a subtraction of terms derived from the real and imaginary components of the impulse response of the filter.

31. Digital filter according to claim 17, characterized in that said transversal filtering means include convolution function generators making use of the Fermat transform.

32. Digital filter according to claim 31, characterized in that it includes: means for storing (said) the desired transform(s) filter coefficients for blocks of the signal coefficients, (as) said blocks being completed by means of a sequence of zeros, and said signal coefficients resulting from an addition or a subtraction of terms derived from the real and imaginary components of the impulse response of the filter.

33. Digital filter according to claim 17, characterized in that said fourth means includes for each transversal filtering path:
means for dividing the (data) signal to be filtered into blocks of finite length, and means for completing each block by means of a sequence of terms equal to zero, and means for alternately routing the blocks thus completed to a first device and to a second device generating (the selected) mathematical transforms for said signal in a system where j is a real number;

multiplier means for multiplying the terms of (the data) said signal transforms as completed by means of a sequence of terms equal to zero, by the corresponding transform terms of the coefficients of (the desired) said transversal filter (as completed by means of a sequence of terms equal to zero);

adder means for adding together the terms provided by said multiplier means and resulting from the processing of two consecutive blocks of (data) signals; and means for developing the inverse transform of the sequence of terms supplied by said adder means.

34. Digital filter according to claim 33, characterized in that it includes: means for storing (said) the desired transform(s) filter coefficients for blocks of the signal coefficients, (as) said blocks being completed by means of a sequence of zeros, and said signal coefficients resulting from an addition or a subtraction of terms derived from the real and imaginary components of the impulse response of the filter.

35. Digital filter for filtering complex signals, characterized in that it includes:
- first and second inputs to which are respectively applied the samples of the real and imaginary components of the signal to be filtered;
- third and fourth inputs to which are respectively applied the coefficients derived from the real and imaginary components of the impulse reponse of the desired filter;
- a device connected to each input which generates the Fermat transform (of) for each of said inputs(,) by processing blocks of terms completed by means of terms equal to zero and by adding the results of such processing of the consecutive blocks taken in pairs;
- means connected to the imaginary component output of each said Fermat transform generator for shifting the bits of the terms of the Fermat transforms derived from the imaginary components of the signals and coefficients;
- first and second adders for adding the transforms of the real components outputs of said Fermat generators to the terms supplied by the means for shifting the corresponding imaginary components;
- first and second subtractors connected to the outputs of said Fermat generators and said shifting means for subtracting the outputs of the shifting means from the transforms of the corresponding real component(s) outputs of said Fermat generators;
- first and second multipliers connected, respectively, to the outputs of said adders and of said subtractors for multiplying, term for term, the outputs of said adders together and those of said subtractors together;
- a third adder and a third subtractor receiving the outputs of both said multipliers; and
- means connected to the outputs of said third adder and means connected to the output of said third subtractor for developing the inverse Fermat transform of the terms supplied by said third adder and said third subtractor.

* * * * *